(12) United States Patent
Boer et al.

(10) Patent No.: US 7,445,948 B2
(45) Date of Patent: *Nov. 4, 2008

(54) METHOD OF MAKING A TFT ARRAY WITH PHOTO-IMAGEABLE INSULATING LAYER OVER ADDRESS LINES

(75) Inventors: Willem den Boer, Troy, MI (US); John Z. Z. Zhong, Troy, MI (US)

(73) Assignee: LG. Display Co., Ltd., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 10/052,772

(22) Filed: Jan. 23, 2002

(65) Prior Publication Data

US 2002/0098629 A1    Jul. 25, 2002

Related U.S. Application Data

(63) Continuation of application No. 08/630,984, filed on Apr. 12, 1996, now Pat. No. 6,372,534, which is a continuation-in-part of application No. 08/470,271, filed on Jun. 6, 1995, now abandoned.

(51) Int. Cl.
   *H01L 21/00* (2006.01)
(52) U.S. Cl. .................................. 438/30; 149/155
(58) Field of Classification Search .............. 438/149, 438/30, 29, 155; 257/57, 59
See application file for complete search history.

(56) References Cited

U.S. PATENT DOCUMENTS 4,431,272 A    2/1984    Yazawa et al. ............... 350/336

4,451,525 A    5/1984    Kawazoe et al. ............. 428/213

(Continued)

FOREIGN PATENT DOCUMENTS

DK         41-40-180 A1    12/1992

(Continued)

OTHER PUBLICATIONS

Wolf et al, "Silicon Processing for the VLSI Era", vol. 1, pp. 407-408, 418-421, 428-429, 1986.*

(Continued)

*Primary Examiner*—Michael Trinh
(74) *Attorney, Agent, or Firm*—McKenna Long & Aldridge LLP

(57) ABSTRACT

This invention is related to a thin film transistor (TFT) array and method of making same, for use in an active matrix liquid crystal display (AMLCD) having a high pixel aperture ratio. The TFT array and corresponding display are made by forming the TFTs and corresponding address lines on a substrate, coating the address lines and TFTs with a photo-imageable insulating layer which acts as a negative resist, exposing portions of the insulating layer with UV light which are to remain on the substrate, removing non-exposed areas of the insulating layer so as to form contact vias, and depositing pixel electrodes on the substrate over the insulating layer so that the pixel electrodes contact respective TFT source electrodes through the contact vias. The resulting display has an increased pixel aperture ratio because the pixel electrodes are formed over the insulating layer so as to overlap portions of the array address lines.

12 Claims, 7 Drawing Sheets

U.S. PATENT DOCUMENTS

| | | | |
|---|---|---|---|
| 4,636,038 A | 1/1987 | Kitahara et al. | 350/339 |
| 4,943,838 A | 7/1990 | Ukai | 257/410 |
| 4,980,002 A | 12/1990 | Dzarnoski, Jr. et al. | |
| 4,994,434 A | 2/1991 | Hung et al. | |
| 5,003,356 A | 3/1991 | Wakai et al. | |
| 5,045,905 A | 9/1991 | Motai et al. | 357/207 |
| 5,055,899 A | 10/1991 | Wakai et al. | |
| 5,072,262 A | 12/1991 | Uekita et al. | 257/410 |
| 5,177,588 A | 1/1993 | Ii et al. | 257/640 |
| 5,182,620 A | 1/1993 | Shimada et al. | |
| 5,229,644 A | 7/1993 | Wakai et al. | 257/749 |
| 5,246,782 A | 9/1993 | Kennedy et al. | |
| 5,281,546 A | 1/1994 | Possin et al. | 437/40 |
| 5,287,208 A | 2/1994 | Shimoto et al. | |
| 5,294,820 A | 3/1994 | Gemma et al. | 257/324 |
| 5,302,987 A | 4/1994 | Kanemori et al. | |
| 5,364,547 A | 11/1994 | Babb et al. | |
| 5,389,492 A | 2/1995 | Kokubo et al. | |
| 5,396,262 A | 3/1995 | Hastings, III | |
| 5,408,345 A | 4/1995 | Mitsui et al. | 349/42 |
| 5,409,777 A | 4/1995 | Kennedy et al. | |
| 5,411,629 A | 5/1995 | Warfield | 216/34 |
| 5,414,278 A | 5/1995 | Kobayashi et al. | |
| 5,414,547 A | 5/1995 | Matsuo et al. | |
| 5,419,991 A | 5/1995 | Segawa | |
| 5,422,293 A | 6/1995 | Konya | |
| 5,426,523 A | 6/1995 | Shimada et al. | |
| 5,445,898 A | 8/1995 | Budzilek et al. | |
| 5,446,562 A | 8/1995 | Sato | |
| 5,453,857 A | 9/1995 | Takahara | |
| 5,457,553 A | 10/1995 | Mori | |
| 5,459,596 A | 10/1995 | Ueda et al. | |
| 5,463,230 A | 10/1995 | Negoto et al. | |
| 5,463,484 A | 10/1995 | Brody | |
| 5,466,535 A * | 11/1995 | Higgins et al. | 428/483 |
| 5,477,359 A * | 12/1995 | Okazaki | 359/77 |
| 5,477,360 A * | 12/1995 | Sunohara et al. | 349/132 |
| 5,483,366 A | 1/1996 | Atherton | |
| 5,486,493 A | 1/1996 | Jeng | 437/195 |
| 5,500,750 A | 3/1996 | Kanbe et al. | 349/42 |
| 5,527,592 A * | 6/1996 | Afzali-Ardakani et al. | 428/209 |
| 5,528,209 A | 6/1996 | Macdonald et al. | |
| 5,559,055 A * | 9/1996 | Chang et al. | 438/586 |
| 5,576,630 A * | 11/1996 | Fujita | 324/760 |
| 5,585,951 A | 12/1996 | Noda et al. | |
| 5,591,676 A | 1/1997 | Hughes et al. | 438/702 |
| 5,600,458 A | 2/1997 | Okano et al. | 349/44 |
| 5,641,974 A | 6/1997 | den Boer et al. | |
| 5,675,187 A | 10/1997 | Numata et al. | 257/758 |
| 5,682,211 A | 10/1997 | Yao et al. | |
| 5,721,596 A | 2/1998 | Kochi | 349/2 |
| 5,721,601 A | 2/1998 | Yamaji et al. | 349/138 |
| 5,724,111 A | 3/1998 | Mizobata et al. | 349/113 |
| 5,780,871 A | 7/1998 | den Boer et al. | |
| 5,780,874 A * | 7/1998 | Kudo | 257/77 |
| 5,818,550 A | 10/1998 | Kadota et al. | |
| 5,821,621 A | 10/1998 | Jeng | 257/759 |
| 5,844,647 A | 12/1998 | Maruno et al. | 349/138 |
| 5,847,720 A * | 12/1998 | Dunand | 347/1 |
| 5,920,084 A | 7/1999 | Gu et al. | |
| 5,994,721 A | 11/1999 | Zhong et al. | 257/89 |
| 6,038,008 A | 3/2000 | Kim et al. | 349/138 |
| 6,100,954 A | 8/2000 | Kim et al. | 349/138 |
| 6,372,534 B1 * | 4/2002 | den Boer et al. | 438/30 |
| 6,376,270 B1 * | 4/2002 | Gu et al. | 438/30 |

FOREIGN PATENT DOCUMENTS

| | | |
|---|---|---|
| EP | 0-486-047 A2 | 5/1992 |
| EP | 0-486-047 A3 | 5/1992 |
| EP | 0 490 335 A2 | 6/1992 |
| EP | 0-536-898 A1 | 4/1993 |
| EP | 0-589-478 A2 | 3/1994 |
| EP | 0-589-478 A3 | 3/1994 |
| EP | 0 603 866 A1 | 6/1994 |
| EP | 0603866 | 6/1994 |
| EP | 0-616-241 A2 | 9/1994 |
| EP | 0-714-140 A1 | 5/1996 |
| GB | 2-311-653 | 10/1997 |
| JP | S62-036684 | 2/1987 |
| JP | 63-279228 | 11/1988 |
| JP | 63-289965 | 11/1988 |
| JP | 02308226 A | 12/1990 |
| JP | 04-068318 | 3/1992 |
| JP | 04-163528 | 6/1992 |
| JP | 04199029 A | 7/1992 |
| JP | 4-257826 A | 9/1992 |
| JP | 04268532 A | 9/1992 |
| JP | 04-307520 | 10/1992 |
| JP | 05-203936 | 8/1993 |
| JP | 05326636 A | 12/1993 |
| JP | 05326641 A | 12/1993 |
| JP | 06-107958 | 4/1994 |
| JP | 06123873 A | 5/1994 |
| JP | 06123878 A | 5/1994 |
| JP | 06208137 A | 7/1994 |
| JP | 06-242433 | 9/1994 |
| JP | 06242433 A | 9/1994 |
| JP | H06-242433 | 9/1994 |
| JP | 07028093 A | 1/1995 |
| JP | 07128670 A | 5/1995 |
| JP | 07146491 A | 6/1995 |
| JP | 10-133165 | 5/1998 |

OTHER PUBLICATIONS

M.J. Radler et al., *Cyclotene™ Advanced Electronics Resins for High-Aperture AMLCD Applications*, SID 96 Applications Digest, pp. 33-36 (1996).

M.J. Radler et al., *Benzocyclobutene Dielectric Resins for Flat Panel Display Applications*, Proceedings of the 3rd Annual Display Manufacturing Technology Conference, pp. 123-124, 1996 (Conference date: Feb. 6-8, 1996).

Willem den Boer et al., *High Aperture TFT LCD using Polymer Interlevel Dielectric*, OIS Optical Imaging Systems, Inc., Northville, MI, USA, no year.

M.W. Friends, *Determination of Dielectric Constant for Fuji Clear*, Mar. 7, 1996, pp. 1-2, including Table.

Willem den Boer, *A Two-Diode Pixel Circuit and Addressing Method for MIM LCDs*, OIS Optical Systems, Inc., Northville, MI, USA, 4 pages, Proceeding Eurodisplay 96.

Tech Notes, Advanced Electronics Resins, *Processing Guide for Photo-Imageable BCB*, Dow Chemical Co., pp. 1-4, no date.

Donald Peretrie, et al., *Benzocyclobutene as a Planarization Resin for Flat Panel Displays*, SPIE Vo., 1965, Liquid Crystal Mateials, Device, and Applications (1992), pp. 331-337.

"A Multi-Level High Density Interconnect Process Designed & Developed for Manufacturability" by Finchem, et. al., 1994.

"Reactive Ion Etching of Benzocyclobutene Using A Silicon Nitride Dielectric Etch Mask" by Schier, J. Electrochem Soc., vol. 142, No. 9, Sep. 1995.

"High Density Multilayer Substrate Using Benzocyclobutene Dielectric" by Shimoto, et. al. , IMC 1992 Proceedings, Yokohama, Jun. 3-5, 1992.

"A 6.4-in-Diagonal Color TFT-LCD Module Suitable for Personal Information Tools" by Takeda, et al, SID 94 Digest.

"Invited Address: High-Aperture TFT Array Structures" by Suzuki, SID 94 Digest.

"A High-Aperture-Ratio TFT-LCD With a Shield-Electrode Structure" by Ueda, et al, SID 93 Digest.

"Optimisation of Very Small Pitch Active Matrix LCD for Projection" by Vignolle, et. al., IEEE, 1991, pp. 223-226.

"A High-Aperture-Ratio 3-in.-Diagonal VGA a-Si Light Valve with Pixel/Data and Pixel/Gate Lines Overlapping" by Sakamoto, et. al. SID 1996 Digest, pp. 681-683.

"High Aperture and Fault-Tolerant Pixel Structure for TFT-LCDs" by Kim, et. al., SID 1995 Digest, pp. 15-18.

Abstract of Japanese Patent Publicatio No. 06242467, dated Sep. 2, 1994, 1 page.

Abstract of Japanese Patent Publication No. 02196221, dated Aug. 2, 1990, 1 page.

Abstract of Japanese Patent Publication No. 04163528; dated Jun. 9, 1992, 1 page.

Abstract of Japanese Patent Publication No. 04291240; dated Oct. 15, 1992, 1 page.

Abstract of Japanese Patent Publication No. 03242625, dated Oct. 29, 1991, 1 page.

M.J. Radker et al., Cyclotene Advanced Electronics Resins for High-Aperture AMLCD,: SID 96 Applications Digest, pp. 33-36.

* cited by examiner

METHOD OF MAKING A TFT ARRAY WITH PHOTO-IMAGEABLE INSULATING LAYER OVER ADDRESS LINES

This application is a continuation application of U.S. Ser. No. 08/630,984, filed Apr. 12, 1996, now U.S. Pat. No. 6,372,534, which is a continuation-in-part (CIP) of U.S. Ser. No. 08/470,271, filed Jun. 6, 1995 entitled LCD WITH INCREASED PIXEL OPENING SIZES, the disclosure of which is hereby incorporated herein by reference.

Additionally, this application is related to a commonly owned application filed simultaneously entitled LCD WITH BUS LINES OVERLAPPED BY PIXEL ELECTRODES AND PHOTO-IMAGEABLE INSULATING LAYER THEREBETWEEN.

This invention relates to a method of making a TFT array for a liquid crystal display (LCD) or image sensor having an increased pixel aperture ratio. More particularly, this invention relates to a method of making an array of TFTs wherein a photo-imageable insulating layer having a plurality of contact vias or apertures disposed therein is located between the address lines and pixel electrodes so that the pixel electrodes are permitted to overlap the row and column address lines without exposing the system to capacitive cross-talk.

BACKGROUND OF THE INVENTION

Electronic matrix arrays find considerable application in X-ray image sensors and active matrix liquid crystal displays (AMLCDs). Such devices generally include X and Y (or row and column) address lines which are horizontally and vertically spaced apart and cross at an angle to one another thereby forming a plurality of crossover points. Associated with each crossover point is an element (e.g. pixel) to be selectively addressed. These elements in many instances are liquid crystal display pixels or alternatively the memory cells or pixels of an electronically adjustable memory array or X-ray sensor array.

Typically, a switching or isolation device such as a diode or thin film transistor (TFT) is associated with each array element or pixel. The isolation devices permit the individual pixels to be selectively addressed by the application of suitable potentials between respective pairs of the X and Y address lines. Thus, the TFTs act as switching elements for energizing or otherwise addressing corresponding pixel electrodes.

Amorphous silicon (a-Si) TFTs have found wide usage for isolation devices in liquid crystal display (LCD) arrays. Structurally, TFTs generally include substantially co-planar source and drain electrodes, a thin film semiconductor material (e.g. a-Si) disposed between the source and drain electrodes, and a gate electrode in proximity to the semiconductor but electrically insulated therefrom by a gate insulator. Current flow through the TFT between the source and drain is controlled by the application of voltage to the gate electrode. The voltage to the gate electrode produces an electric field which accumulates a charged region near the semiconductor-gate insulator interface. This charged region forms a current conducting channel in the semiconductor through which current is conducted. Thus, by controlling the voltage to the gate and drain electrodes, the pixels of an AMLCD may be switched on and off in a known manner.

Typically, pixel aperture ratios (i.e. pixel openings) in non-overlapping AMLCDs are only about 50% or less. As a result, either display luminance is limited or backlight power consumption is excessive, thereby precluding or limiting use in certain applications. Thus, it is known in the art that it is desirable to increase the pixel aperture ratio or pixel opening size of LCDs to as high a value as possible so as to circumvent these problems. The higher the pixel aperture ratio (or pixel opening size) of a display, for example, the higher the display transmission. Thus, by increasing the pixel aperture ratio of a display, transmission may be increased using the same backlight power, or alternatively, the backlight power consumption may be reduced while maintaining the same display luminance.

It is known to overlap pixel electrodes over address lines in order to increase the pixel aperture ratio. For example, "High-Aperture TFT Array Structures" by K. Suzuki discusses an LCD having an ITO shield plane configuration having a pixel aperture ratio of 40% and pixel electrodes which overlap signal bus lines. An ITO pattern in Suzuki located between the pixel electrodes and the signal lines functions as a ground plane so as to reduce coupling capacitance between the signal lines and the pixel electrode. Unfortunately, it is not always desirable to have a shield electrode disposed along the length of the signal lines as in Suzuki due to production and cost considerations. The disposition of the shield layer as described by Suzuki requires extra processing steps and thus presents yield problems. Accordingly, there exists a need in the art for a LCD with an increased pixel aperture ratio which does not require an ITO shield plane structure to be disposed between the signal lines and pixel electrode.

It is old and well-known to make TFT arrays for LCDs wherein address lines and overlapping pixel electrodes are insulated from one another by an insulating layer. For example, see U.S. Pat. Nos. 5,055,899; 5,182,620; 5,414,547; 5,426,523; 5,446,562; 5,453,857; and 5,457,553.

U.S. Pat. No. 5,182,620 discloses an AMLCD including pixel electrodes which at least partially overlay the address lines and additional capacitor lines thereby achieving a larger numerical aperture for the display. The pixel electrodes are insulated from the address lines which they overlap by an insulating layer formed of silicon oxide or silicon nitride. Unfortunately, the method of making this display as well as the resulting structure are less than desirable because: (i) chemical vapor deposition (CVD) is required to deposit the silicon oxide or silicon nitride insulating film; and (ii) silicon oxide and silicon nitride are not photo-imageable (i.e. contact holes or vias must be formed in such insulating layers by way of etching). As a result of these two problems, the manufacturing process is both expensive and requires more steps than would be otherwise desirable. For example, in order to etch the contact holes in an insulating layer, an additional photoresist coating step is required and the user must be concerned about layers underneath the insulating layer during etching. With respect to CVD, this is a deposition process requiring expensive equipment.

U.S. Pat. No. 5,453,857 discloses an AMLCD having a TFT array with pixel electrodes formed in an overlapping relation with source signal lines through an insulating thin film. The insulating thin film formed between the signal lines and the pixel electrodes is made of either $SiN_x$, $SiO_2$, $TaO_x$ or $Al_2O_3$. Unfortunately, the method of making the array and resulting display of the '857 patent suffers from the same problems discussed above with respect to the '620 patent. None of the possible insulating layer materials are photo-imageable and etching is required.

U.S. Pat. No. 5,055,899 discloses a TFT array including an insulating film disposed between the address lines and pixel electrodes. Again, etching is required to form the vias in the insulating film. This is undesirable.

U.S. Pat. No. 5,426,523 discloses an LCD including overlapping pixel electrodes and source bus lines, with a silicon oxide insulating film disposed therebetween. Silicon oxide is not photo-imageable and thus necessitates a prolonged and more difficult manufacturing process for the TFT array and resulting AMLCD.

It is apparent from the above that there exists a need in the art for an improved method for manufacturing a TFT array and/or resulting LCD having an increased pixel aperture ratio and little capacitive cross-talk. The method of manufacture, which is improved relative to the prior art, should include forming a photo-imageable insulating layer between pixel electrodes and overlapped bus lines and the vias therein by way of photo-imaging as opposed to resist coating, exposure and developing, and wet or dry etching. The method should be simpler, cheaper, and more efficient to carry out.

It is a purpose of this invention to fulfill the above-described needs in the art, as well as other needs which will become apparent to the skilled artisan from the following detailed description of this invention.

SUMMARY OF THE INVENTION

Generally speaking, this invention fulfills the above-described needs in the art by providing a method of making an array of a-Si semiconductor based thin film transistors (TFTs), the method comprising the steps of:

providing a first substantially transparent substrate;

forming an array of TFTs and corresponding address lines on the first substrate;

depositing an organic photo-imageable insulating layer over the TFT array and corresponding address lines;

photo-imaging the insulating layer in order to form a first array of vias or contact holes therein; and forming an array of electrode members on the first substrate over the photo-imaged insulating layer so that the electrode members in the array are in communication with the TFTs through the first array of vias or contact holes.

In certain preferred embodiments, the method includes the step of overlapping the address lines with the electrode members so that the photo-imaged insulating layer is disposed therebetween so as to increase the pixel aperture and reduce cross-talk.

In still further preferred embodiments, the method comprises the steps of: (i) using the TFT array in one of a liquid crystal display and an X-ray image sensor, and (ii) forming the insulating layer so as to include one of photo-imageable Benzocyclobutene (BCB) and 2-Ethoxyethyl acetate.

This invention further fulfills the above-described needs in the art by providing a method of making a liquid crystal display including an array of semiconductor switching elements, the method comprising the steps of:

a) providing a first substrate;

b) providing an array of semiconductor based switching elements and corresponding address lines on the first substrate;

c) spin coating an organic photo-imageable insulating layer on the first substrate over the switching elements and address lines;

d) photo-imaging the insulating layer in order to form a first group of vias or contact holes therein, each via in the first group corresponding to one of the switching elements; and e) forming an array of pixel electrodes over the photo-imaged insulating layer so that each pixel electrode communicates with one of the switching elements through one of the vias in the insulating layer.

This invention still further fulfills the above-described needs in the art by providing a method of making a TFT array comprising the steps of:

a) providing a first substantially transparent substrate;

b) forming a plurality of TFT gate electrodes connected to gate lines on the substrate;

c) forming a gate insulating layer over the gate electrodes;

d) forming and patterning a semiconductor layer over each of the gate electrodes in TFT areas;

e) forming TFT source and drain electrodes in each TFT area with a TFT channel defined therebetween, and a plurality of corresponding drain lines, thereby forming an array of TFTs on the first substrate;

f) depositing a photo-imageable insulating layer over a substantial portion of the substrate so as to cover substantial portions of the gate and drain lines and the TFTs in the array;

g) photo-imaging the insulating layer so as to form a plurality of vias or contact holes therein, at least one via corresponding to each TFT in the array;

h) forming a plurality of pixel electrodes over the insulating layer so that each pixel electrode is in communication with the source electrode of a corresponding TFT through one of the vias; and i) forming the pixel electrodes on the substrate so that each pixel electrode overlaps at least one of the drain and gate lines whereby the pixel electrodes are insulated from the address lines in the overlap areas by the photo-imaged insulating layer.

This invention will now be described with reference to certain embodiments thereof as illustrated in the following drawings.

IN THE DRAWINGS

DETAILED DESCRIPTION OF CERTAIN EMBODIMENTS OF THIS INVENTION

Figure 1:
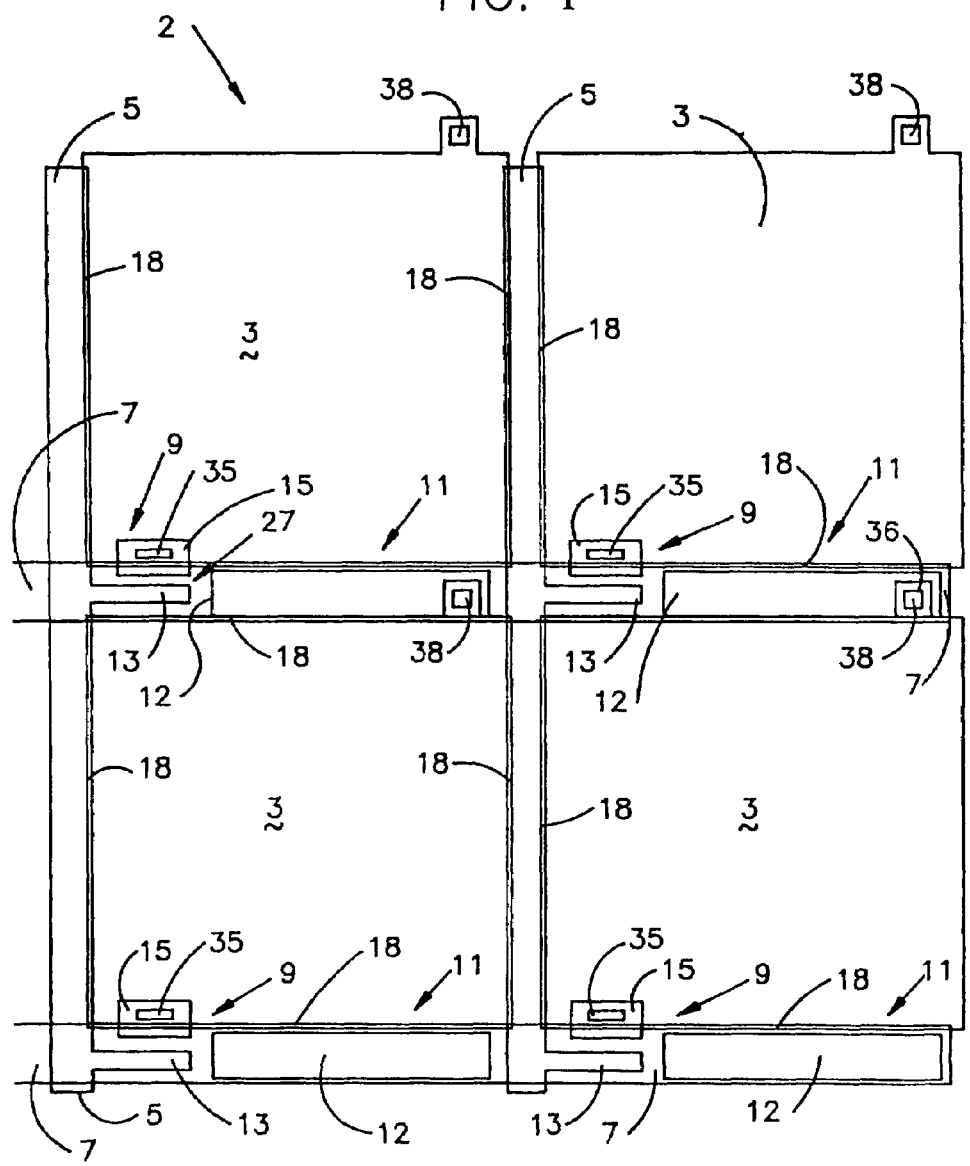
FIG. 1 is a top view of an AMLCD according to this invention, this figure illustrating pixel electrodes overlapping surrounding row and column address lines along their respective lengths throughout the display's pixel area so as to increase the pixel aperture ratio of the display.

Referring now more particularly to the accompanying drawings in which like reference numerals indicate like parts throughout the several views.

FIG. 1 is a top view of four pixels in an array of an active matrix liquid crystal display (AMLCD) 2 according to an embodiment of this invention. This portion of the display includes pixel electrodes 3, drain address lines 5, gate address lines 7, an array of four thin film transistors (TFTs) 9, and auxiliary storage capacitors 11 associated with each pixel. Each storage capacitor 11 is defined on one side by a gate line 7 and on the other side by an independent storage capacitor electrode 12. Storage capacitor electrodes 12 are formed along with drain electrodes 13. As shown, the longitudinally extending edges of each pixel electrode 3 overlap drain lines 5 and gate lines 7 respectively along the edges thereof so as to increase the pixel aperture ratio (or pixel opening size) of the LCD.

In the areas of overlap 18 between pixel electrodes 3 and address or bus lines 5, 7, a pixel-line (PL) capacitor is defined by an electrode 3 on one side and the overlapped address line on the other. The dielectric disposed between the electrodes of these PL capacitors is insulation layer 33 (see FIGS. 4 and 7). The parasitic capacitance $C_{PL}$ of these capacitors is defined by the equation:

$$C_{PL} = \frac{\epsilon \cdot \epsilon_0 \cdot A}{d}$$

where "d" is the thickness of layer 33, $\epsilon$ is the dielectric constant of layer 33, $\epsilon_0$ is the constant $8.85 \times 10^{-14}$ F/cm (permitivity in vacuum), and "A" is the area of the PL capacitor in overlap areas 18. The fringing capacitance may also be taken into consideration in a known manner. See Chart 1 below for certain embodiments. Also, according to other embodiments, $C_{PL}$ is less than or equal to about 0.01 pF for a display with a pixel pitch of about 150 μm. When the pixel pitch is smaller, $C_{PL}$ should be scaled to a lower value as well because overlap areas 18 are smaller. Additionally, the pixel aperture ratio of an LCD decreases as the pixel pitch decreases as is known in the art. The pixel pitch of AMLCD 2 may be from about 40 to 5,000 μm according to certain embodiments of this invention. The pixel pitch as known in the art is the distance between centers of adjacent pixels in the array.

Figure 2:
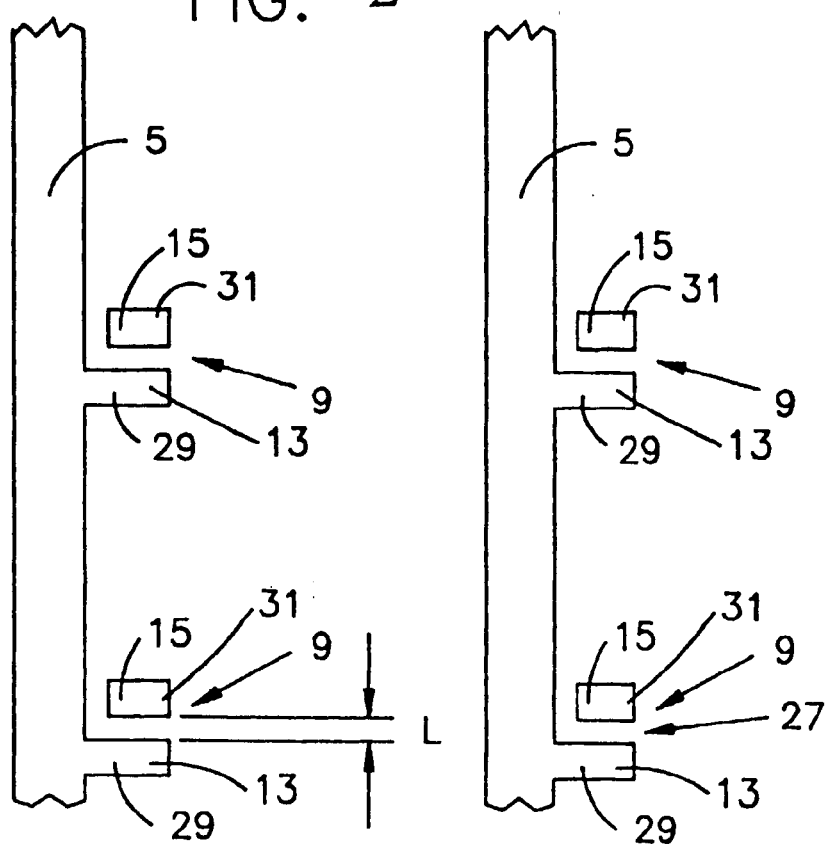
FIG. 2 is a top view of the column (or drain) address lines and corresponding drain electrodes of FIG. 1, this figure also illustrating the TFT source electrodes disposed adjacent the drain electrodes so as to define the TFT channels.

FIG. 2 is a top view of drain address lines 5 of AMLCD 2 showing how extensions of address lines 5 form drain electrodes 13 of TFTs 9. Each TFT 9 in the array of AMLCD 2 includes source electrode 15, drain electrode 13, and gate electrode 17. Gate electrode 17 of each TFT 9 is formed by the corresponding gate address line 7 adjacent the TFT according to certain embodiments. According to other embodiments, the gate electrode 17 may be formed by a branch extending substantially perpendicular to the gate line.

Figure 3:
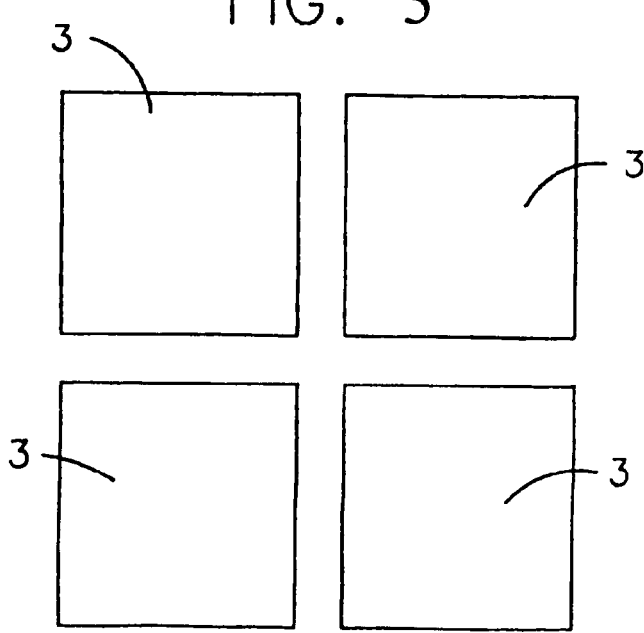
FIG. 3 is a top view of the pixel electrodes of FIG. 1 except for their extensions.

FIG. 3 is a top view illustrating pixel electrodes 3 (absent their extension portions 38) of AMLCD 2 arranged in array form. FIGS. 2-3 are provided so that FIG. 1 may be more easily interpreted.

Figure 4:
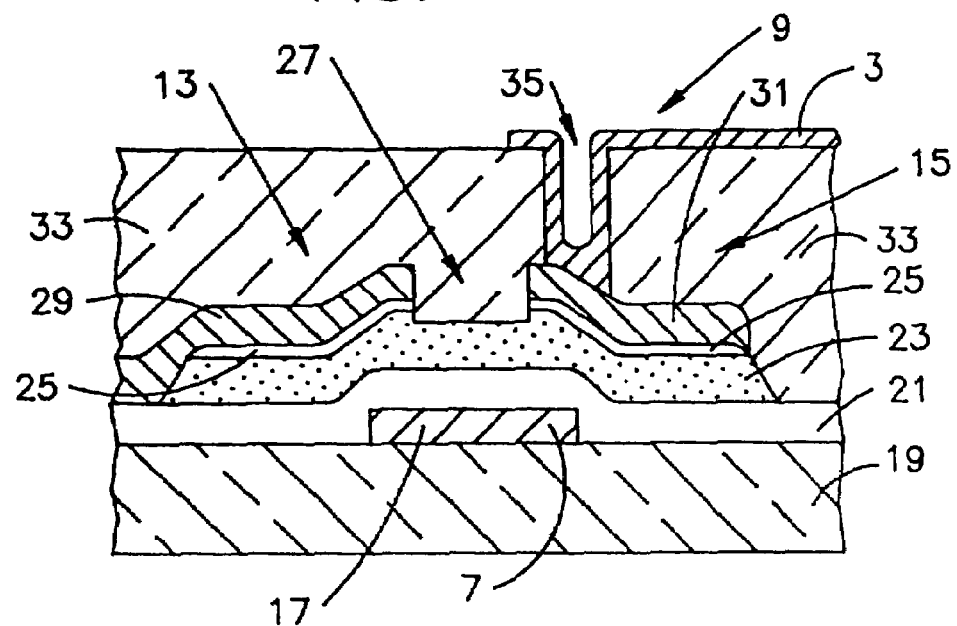
FIG. 4 is a side elevational cross-sectional view of the linear-shaped thin film transistors (TFTs) of FIGS. 1-2.

FIG. 4 is a side elevational cross-sectional view of a single thin film transistor (TFT) 9 in the TFT array of AMLCD 2, with each TFT 9 in the array being substantially the same according to preferred embodiments. Each linear TFT 9 has a channel length "L" defined by the gap 27 between source electrode 15 and drain electrode 13. Source electrode 15 is connected to pixel electrode 3 by way of via or contact hole 35 so as to permit TFT 9 to act as a switching element and selectively energize a corresponding pixel in AMLCD 2 in order to provide image data to a viewer. An array of TFTs 9 is provided as illustrated in FIG. 1 for AMLCD 2.

Each TFT 9 structure includes substantially transparent substrate 19 (e.g. made of glass), metal gate electrode 17, gate insulating layer or film 21, semiconductor layer 23 (e.g. intrinsic amorphous silicon), doped semiconductor contact layer 25, drain electrode 13, source electrode 15, substantially transparent insulation layer 33, and a corresponding pixel electrode 3. TFT channel 27 of length "L" is defined between source 15 and drain 13.

As shown in FIG. 4, drain electrode 13 is made up of drain metal layer 29 (e.g. Mo) which is deposited on substrate 19 over top of doped contact layer 25. Contact film or layer 25 may be, for example, amorphous silicon doped with an impurity such as phosphorous (i.e. n+a-Si) and is sandwiched between semiconductor layer 23 and drain metal layer 29. Source electrode 15 includes doped semiconductor contact layer 25 and source metal layer 31. Metal layers 29 and 31 may be of the same metal and deposited and patterned together according to certain embodiments of this invention. Alternatively, layer 29 may be deposited and patterned separately from layer 31 so that drain metal layer is of one metal (e.g. Mo) and source metal layer 31 is of another (e.g. Cr).

Substantially transparent insulating layer 33 having a dielectric constant less than about 5.0 is deposited as a sheet on substrate 19 so as to cover TFTs 9 and address lines 5 and 7. Layer 33 is formed of a photo-imageable material such as Fuji Clear™ or a photo-imageable type of BCB. Insulating layer 33 is continuous in the viewing area of the display except for vias or contact holes 35 and 36 formed therein to allow pixel electrodes 3 to contact corresponding TFT source electrodes and the storage capacitor electrodes respectively (i.e. each pixel includes two vias (35 and 36) in insulating layer 33—one for the source electrode and the other for the storage capacitor).

Layer 33 has a dielectric constant $\epsilon$ less than or equal to about 5.0 according to certain embodiments of this invention. In certain preferred embodiments, layer 33 has a dielectric constant of about 2.7 and is made of a photo-imageable type of Benzocyclobutene (BCB), an organic material available from Dow Chemical, for the purpose of reducing capacitive cross-talk (or capacitive coupling) between pixel electrodes 3 and the address lines in overlap areas 18. Layer 33 has a low dielectric constant and/or a relatively large thickness for the specific purpose of reducing $C_{PL}$ in overlap areas 18.

Alternatively, layer 33 may be of a photo-imageable material known as Fuji Clear™, which is an organic mixture including 2-Ethoxyethyl acetate (55-70%), methacrylate derivative copolymer (10-20%), and polyfunctional acrylate (10-20%).

Following the deposition of insulation layer 33 on substrate 19 over top of TFTs 9 and address lines 5 and 7, vias 35 and 36 are formed in insulation layer 33 by way of photo-imaging. Layer 33 acts as a negative resist so that UV exposed areas remain on the substrate and areas of layer 33 unexposed to UV during photo-imaging are removed during developing. Following the forming of vias 35 and 36, substantially transparent pixel electrodes 3 (made of indium-tin-oxide or ITO) are deposited and patterned over layer 33 on substrate 19 so that the pixel electrodes 3 contact the corresponding source metal layers 31 of corresponding TFTs 9 through vias 35 as illustrated in FIG. 4. Auxiliary vias 36 (see FIG. 1) are formed in layer 33 at the same time as vias 35 so that pixel electrodes 3 can contact storage capacitor electrodes 12 via pixel electrode extensions 38. Peripheral lead areas and seal areas are also removed by photo-imaging.

Insulating layer 33 is deposited on substrate 19 over the address lines, storage capacitors, and TFTs to a thickness "d" of at least about 0.5 μm in overlap areas 18. In preferred embodiments, the thickness "d" of insulating layer 33 is from about 1 to 2.5 μm.

Another advantage of layer 33 is that liquid crystal layer disclinations induced at pixel electrode 3 edges by the topography of TFTs 9, storage capacitors, and address lines are substantially eliminated by planarization (i.e. few, if any, hills and valleys are present in the top surface of layer 33). Thus, the thickness of the LC layer is substantially maintained and display functionality is improved because electrodes 3 are substantially flat because of the substantial planarization of the surface of layer 33 adjacent the pixel electrodes 3.

Because of the low dielectric constant $\in$ and/or relatively high thickness "d" of layer 33, the capacitive cross-talk problems of the prior art resulting from overly high $C_{PL}$ values are substantially reduced in areas 18 where pixel electrodes 3 overlap address lines 5 and/or 7. Because layer 33 is disposed between pixel electrodes 3 and the overlapped address lines, the capacitive cross-talk problems of the prior art are substantially reduced or eliminated and increased pixel openings are achievable without sacrificing display performance (pixel isolation).

Pixel opening sizes or the pixel aperture ratio of AMLCD 2 is at least about 65% (preferably from about 68% to 80%) according to certain embodiments of this invention when the pixel pitch is about 150 μm. This will, of course, vary depending upon the pixel pitch of the display (pixel pitches of from about 40-500 μm may be used). Pixel electrodes 3 overlap address lines 5 and 7 along the edges thereof as shown in FIG. 1 by an amount up to about 3 μm. In certain preferred embodiments of this invention, the overlap 18 of electrodes 3 over the edges of address lines 5 and 7 is designed to be from about 2 to 3 μm, with the end result after overetching being at least about 0.5 μm. According to certain other embodiments of this invention, the amount of overlap may be designed to be from about 2-3 μm, with the resulting post-processing overlap being from about 0 to 2 μm. The overlap amount may be adjusted in accordance with different LCD applications and pixel pitch sizes as will be appreciated by those of skill in the art.

In certain situations, after etching and processing, pixel electrodes 3 may not overlap the address lines at all according to certain embodiments of this invention, although some overlap 18 is preferred. When no overlap occurs, the parasitic capacitance $C_{PL}$ between the address lines and the adjacent pixel electrode 3 is still minimized or reduced due to insulating layer 33.

Referring now to FIGS. 4-5 and 8-11, it will be described how AMLCD 2 including the array of TFT structures and corresponding address lines is made according to an embodiment of this invention. Firstly, substantially transparent substrate 19 is provided. Next, a gate metal layer or sheet (which results in gate electrodes 17 and lines 7) is deposited on the top surface (surface to be closest to the LC layer) of substrate 19 to a thickness of from about 1,000-5,000 Å, most preferably to a thickness of about 2,500 Å. The gate metal sheet is deposited by way of sputtering or vapor deposition. The gate metal may be of tantalum (Ta) according to certain embodiments of this invention. Insulating substrate 19 may be of glass, quartz, sapphire, or the like.

The structure including substrate 19 and the deposited gate metal is then patterned by photolithography to the desired gate electrode 17 and gate address line 7 configuration. The upper surface of the gate metal is exposed in a window where the photoresist has not been retained.

The gate metal (e.g. Ta) layer is then dry etched (preferably using reactive ion etching) in order to pattern the gate metal layer in accordance with the retained photoresist pattern. To do this, the structure is mounted in a known reactive ion etching (RIE) apparatus which is then purged and evacuated in accordance with known RIE procedures and etchants. This etching of the gate metal layer is preferably carried out until the gate metal is removed in center areas of the windows and is then permitted to proceed for an additional time (e.g. 20 to 40 seconds) of overetching to ensure that the gate metal is entirely removed from within the windows. The result is gate address lines 7 (and gate electrodes 17) being left on substrate 19.

Figure 8:
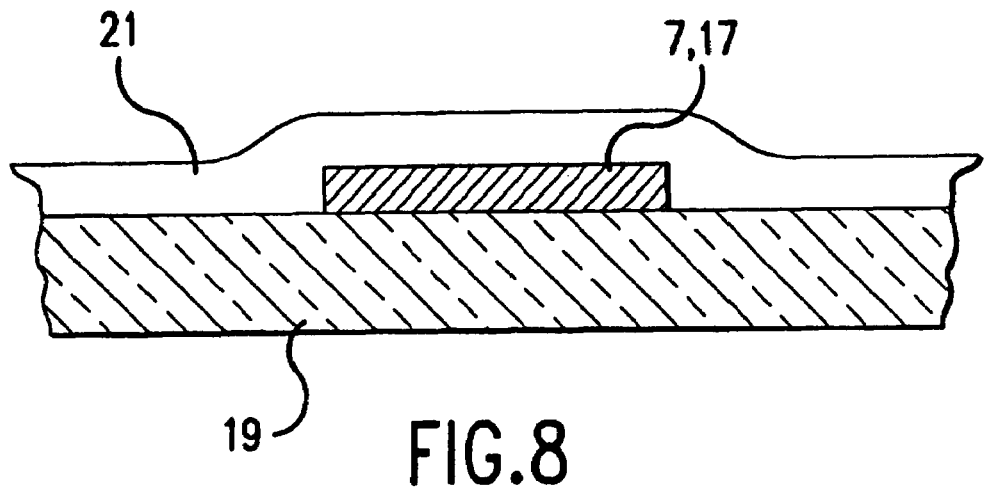
FIGS. 8-11 are side elevational cross-sectional views illustrating how a TFT in an array according to this invention is manufactured.

After gate address lines 7 are deposited and patterned on top of substrate 19 in the above-described manner, gate insulating or dielectric layer 21 is deposited over substantially the entire substrate 19 preferably by plasma enhanced chemical vapor deposition (CVD) or some other process known to produce a high integrity dielectric. The resulting structure is shown in FIG. 8. Gate insulating layer 21 is preferably silicon nitride ($Si_3N_4$) but may also be silicon dioxide or other known dielectrics. Silicon Nitride has a dielectric constant of about 6.4. Gate insulating layer 21 is deposited to a thickness of from about 2,000-3,000 Å (preferably either about 2,000 Å or 3,000 Å) according to certain embodiments.

It is noted that after anodization (which is optional), gate Ta layer 17 which was deposited as the gate electrode and gate line layer (when originally about 2,500 Å thick) is about 1,800 Å thick and a newly created TaO layer is about 1,600 Å. Anodization takes place after the gate line patterning and before further processing. Thus, gate insulating layer 21 over gate lines 7 and electrodes 17 is made up of both the anodization created TaO layer and the silicon nitride layer. Other metals from which gate electrode 17 and address line layer 7 may be made include Cr, Al, titanium, tungsten, copper, and combinations thereof.

Next, after gate insulating layer 21 has been deposited (FIG. 8), semiconductor (e.g. intrinsic a-Si) layer 23 is deposited on top of gate insulating layer 21 to a thickness of about 2,000 Å. Semiconductor layer 23 may be from about 1,000 Å to 4,000 Å thick in certain embodiments of this invention. Then, doped (typically phosphorous doped, that is n+) amorphous silicon contact layer 25 is deposited over intrinsic a-Si layer 23 in a known manner to a thickness of, for example, about 500 Å. Doped contact layer 25 may be from about 200 Å to 1,000 Å thick according to certain embodiments of this invention. The result is the FIG. 9 structure.

Gate insulating layer 21, semiconductor layer 23 and semiconductor contact layer 25 may all be deposited on substrate 19 in the same deposition chamber without breaking the vacuum according to certain embodiments of this invention. When this is done, the plasma discharge in the deposition chamber is stopped after the completion of the deposition of a particular layer (e.g. insulating layer 21) until the proper gas composition for deposition of the next layer (e.g. semiconductor layer 23) is established. Subsequently, the plasma discharge is re-established to deposit the next layer (e.g. semiconductor layer 23). Alternatively, layers 21, 23, and 25 may be deposited in different chambers by any known method.

Figure 9:
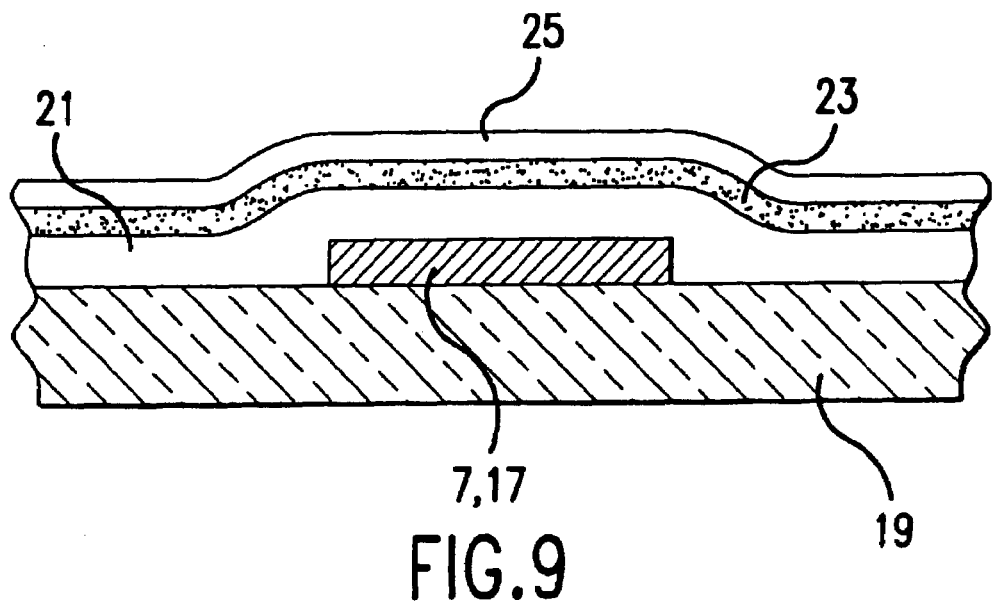

Following the formation of the FIG. 9 structure, the TFT island or area may be formed by way of etching, for example, so that the TFT metal layers can be deposited thereon. Optionally, one of the TFT metal source/drain layers may be deposited before forming the TFT island.

According to preferred embodiments, following the formation of the TFT island from the FIG. 9 structure, a source-drain metal sheet or layer (which results in drain metal layer 29 and source metal layer 31) is deposited on substrate 19 over top of semiconductor layer 23 and contact layer 25. This source-drain metal layer may be chromium (Cr) or molybdenum (Mo) according to certain embodiments of this invention. When chromium, the layer is deposited to a thickness of about 500-2,000 Å, preferably about 1,000 Å according to certain embodiments. When molybdenum, the layer is deposited to a thickness of from about 2,000 to 7,000 Å, preferably about 5,000 Å. The deposited source drain metal layer sheet is then patterned (masked and etched) to form the source, drain, and storage capacitor electrodes. After patterning of the TFT source and drain electrodes, the result is the FIG. 10 TFT structure.

Alternatively, a first metal layer may be deposited and patterned to form drain electrode portion 29 and storage capacitor electrode 12, and a second metal layer may be deposited and patterned to form source electrode portion 31. Thus, for example, source metal layer 31 may be chromium (Cr) while drain metal 29 and storage capacitor electrode layer is Mo according to certain embodiments of this invention. Other metals which may be used for the source and drain metals include titanium, Al, tungsten, tantalum, copper, or the like.

Figure 10:
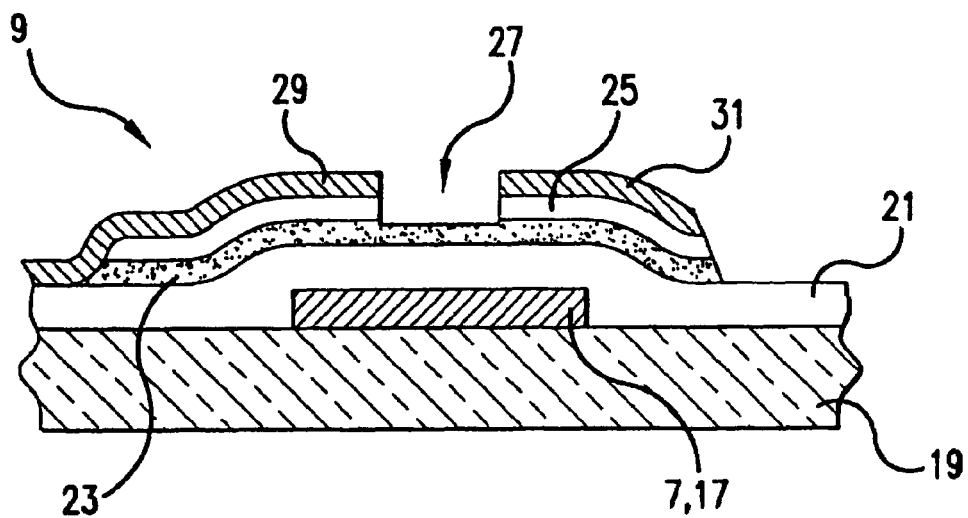
Figure 11:
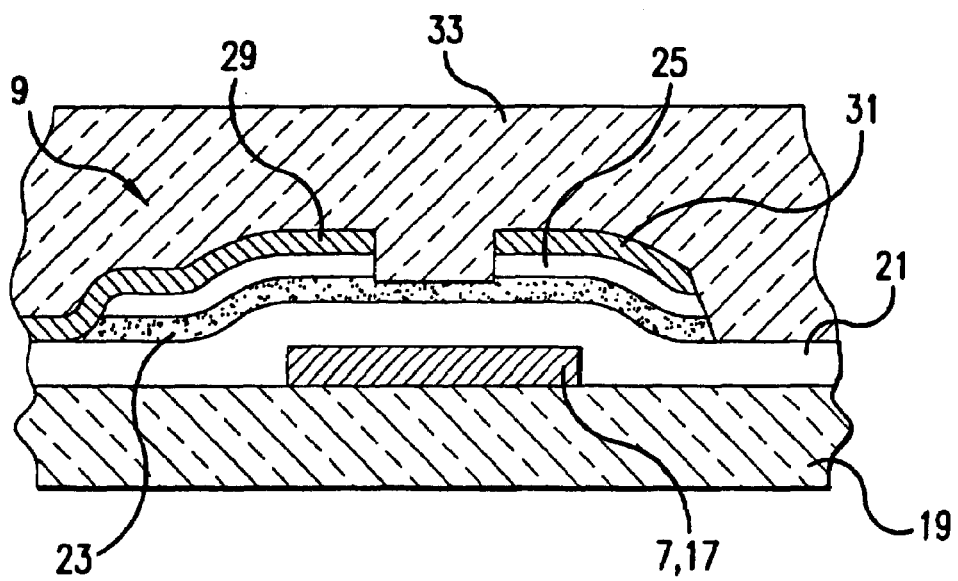

After patterning of drain and source portions 29 and 31, contact layer 25 is etched in the channel 27 area and inevitably a bit of semiconductor layer 23 is etched along with it. The result is TFT 9 with channel 27 as shown in FIGS. 4 and 10.

Substantially transparent polymer insulating layer 33 is then deposited onto substantially the entire substrate 19 by way of spin-coating according to certain embodiments of this invention. Layer 33 may be of either photo-imageable BCB or Fuji Clear™ according to certain embodiments. Insulating layer 33 fills recesses generated upon formation of TFTs 9 and flattens the surface above substrate 19 at least about 60% according to certain embodiments. The result is the structure of FIG. 11.

Photo-imageable insulating layer 33 acts as a negative resist layer according to certain embodiments of this invention so that no additional photoresist is needed to form vias 35 and 36 in layer 33. In order to form the vias, layer 33 is irradiated by ultraviolet (UV) rays (e.g. i rays of 365 nm), with UV irradiated areas of layer 33 to remain and non-exposed or non-radiated areas of layer 33 to be removed in developing. A mask may be used. Thus, the areas of the negative resist 33 corresponding to vias 35 and 36 are not exposed to the UV radiation, while the rest of the layer 33 across the substrate is exposed to UV.

Following exposure of layer 33 (except in the via or contact hole areas), layer 33 is developed by using a known developing solution at a known concentration. In the developing stage, the areas of layer 33 corresponding to vias 35 and 36 are removed (i.e. dissolved) so as to form the vias in the insulating layer. After developing, the resist layer 33 is cured or subjected to postbaking (e.g. about 240 degrees C. for about one hour) to eliminate the solvent so that the layer 33 with the vias therein is resinified. Thus, no dry or wet etching is needed to form the vias in layer 33. According to alternative embodiments, layer 33 may be a positive resist as opposed to a negative resist.

Vias or apertures 35 are thus formed in insulation layer 33 over top of (or adjacent) each source metal electrode 31 so as to permit the pixel electrodes 3 to electrically contact corresponding source electrodes 15 through vias 35. Layer 33 remains across the rest of the substrate or array except for the auxiliary capacitor vias and certain edge areas where contacts must be made or glueing done.

After vias 35 and 36 are formed in layer 33, a substantially transparent conducting layer (e.g. ITO) which results in pixel electrodes 3 is deposited and patterned (photomasked and etched) on substrate 19 over top of layer 33. After patterning (e.g. mask and etching) of this substantially transparent conducting layer, pixel electrodes 3 are left as shown in FIGS. 1 and 4. As a result of vias 35 and 36 formed in layer 33, each pixel electrode 3 contacts a TFT source electrode 31 as shown in FIG. 4 and a storage capacitor electrode 12 as shown in FIG. 1. The result is the active plate of FIGS. 1 and 4 including an array of TFTs. The pixel electrode layer (when made of ITO) is deposited to a thickness of from about 1,200 to 3,000 Å (preferably about 1,400 Å) according to certain embodiments of this invention. Other known materials may be used as pixel electrode layer 3.

Figure 5:
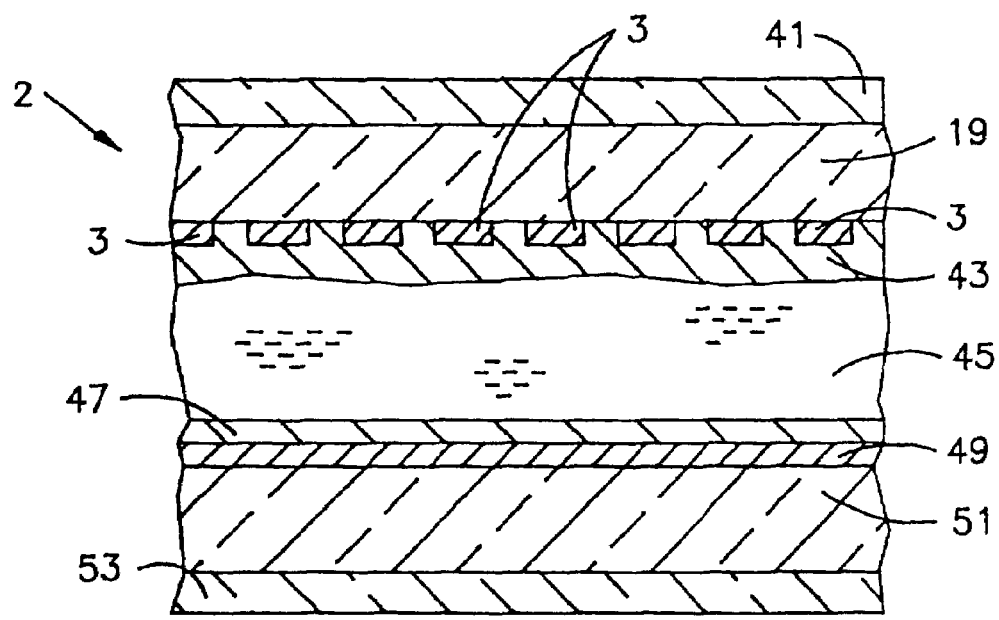
FIG. 5 is a side elevational cross-sectional view of the liquid crystal display of FIG. 1.

After formation of the active plate, liquid crystal layer 45 is disposed and sealed between the active plate and the passive plate as shown in FIG. 5, the passive plate including substrate 51, polarizer 53, electrode 49, and orientation film 47.

As shown in FIG. 1, pixel electrodes 3 are patterned to a size so that they overlap both drain address lines 5 and gate address lines 7 along the edges thereof so as to result in an increased pixel aperture ratio for AMLCD 2. The cross-talk problems of the prior art are substantially eliminated due to the presence of layer 33 in overlap areas 18 between pixel electrodes 3 and the address lines. Alternatively, the pixel electrodes may only overlap one group of address lines (e.g. row lines) according to certain embodiments.

FIG. 5 is a side elevational cross-sectional view of AMLCD 2 (absent the TFTs, address lines, and black matrix). As shown, the twisted nematic display includes from the rear forward toward the viewer, rear polarizer 41, substantially transparent substrate 19, pixel electrodes 3, rear orientation film 43, liquid crystal layer 45, front orientation film 47, common electrode 49, front substantially transparent substrate 51, and finally front polarizer 53. Polarizers 41 and 53 may be arranged so that their transmission axes are either parallel or perpendicular to each other so as to define a normally black or normally white color AMLCD respectively. Optionally, retarder(s) may also be provided.

Typically, a backlight is provided rearward of polarizer 41 so that light emitted therefrom first goes through polarizer 41, then through liquid crystal layer 45 and finally out of front polarizer 53 toward the viewer. Pixel electrodes 3 selectively work in conjunction with common electrode 49 so as to selectively apply voltages across liquid crystal layer 45 so as to cause an image (preferably colored according to certain embodiments) to be viewed from the front of the display.

Figure 6:
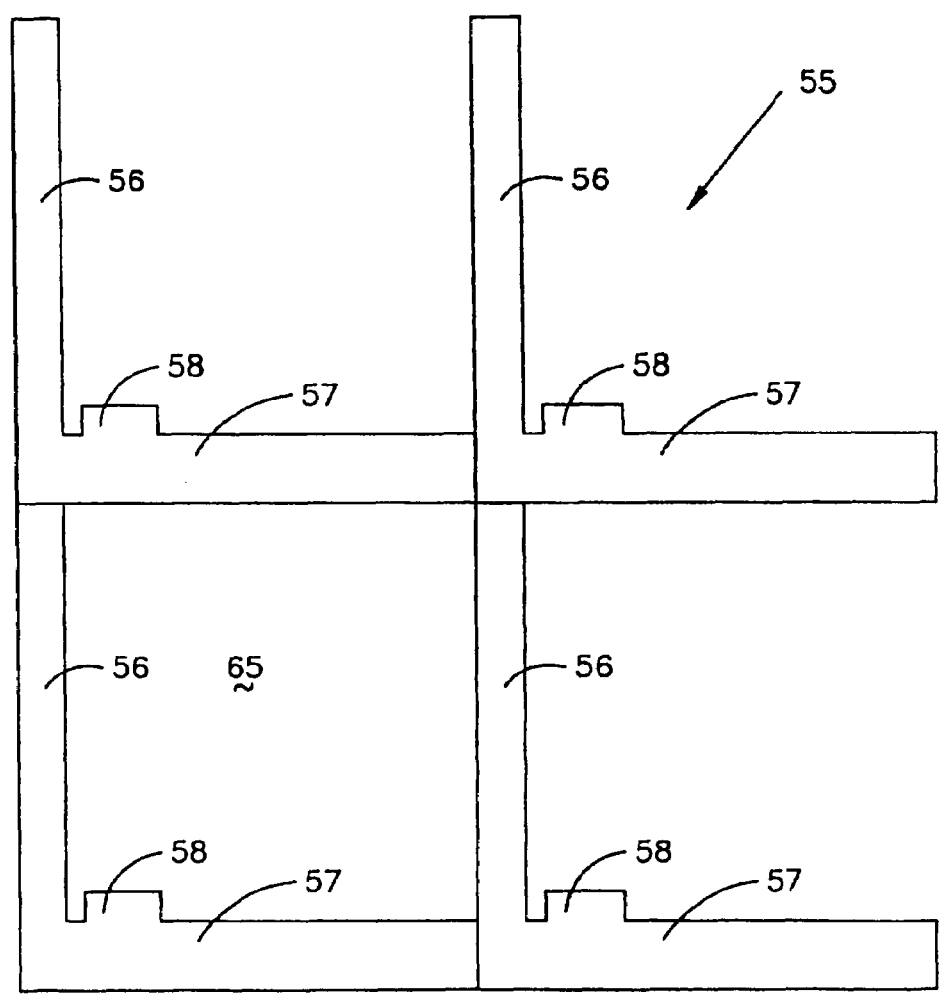
FIG. 6 is a top or bottom view of the optional black matrix to be located on a substrate of the LCD of FIGS. 1-5, the black matrix to be located on the substrate not having the TFT array disposed thereon.

FIG. 6 illustrates an optional black matrix (BM) pattern 55 to be disposed on front substrate 51 for the purpose of overlaying address lines 5 and 7 and TFT channels 27. When the ITO of the pixel electrodes 3 overlaps the address lines, the address lines themselves are effectively the black matrix blocking light in the interpixel areas. However, low reflectance black matrix 55 with a larger than normal opening is still useful on the top (or passive) plate in order to reduce specular reflectance and to prevent ambient light incidence on the TFT channels. Therefore, the pixel aperture ratio of the display can be made larger because the pixel electrode area is larger and the overlap between the pixel electrodes on the active plate and black matrix 55 on the passive plate can be reduced.

Black matrix structure 55 includes vertically extending regions 56 and horizontally extending regions 57. Regions 56 are aligned with drain lines 5 while regions 57 are aligned with gate lines 7 so as to prevent ambient light from penetrating the display. Additionally, black matrix 55 includes channel covering portions 58 which are aligned with TFT channels 27 for the purpose of preventing ambient light from reaching amorphous silicon semiconductor layer 23 through the channels. As commonly known in the art, the pixel openings 65 of the display are substantially defined by (i.e. bounded by) black matrix regions 56 and 57.

Figure 7:
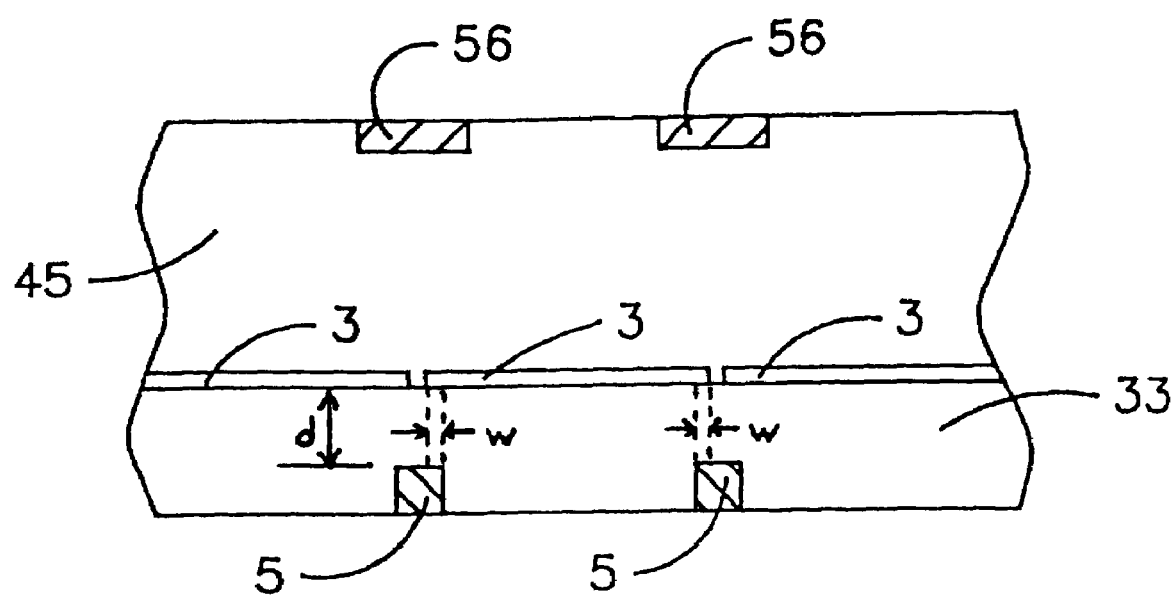
FIG. 7 is a side cross-sectional view of a portion of the LCD of FIGS. 1-6, this figure illustrating the pixel electrodes overlapping the column address lines.

FIG. 7 is a side elevational cross-sectional view of a portion of AMLCD 2. As shown, the central pixel electrode 3 illustrated in FIG. 7 overlaps both column or drain address lines 5 by an amount "w" thereby increasing the pixel electrode size relative to that of many prior art displays. Electrodes 3 are spaced from the address lines by a distance "d". Also, black matrix portions 56 line up with address lines 5 so that the pixel aperture or opening for the center electrode 3 is defined in part by the distance between black matrix members 56. Black matrix portions 56 and address lines 5 are both arranged so that their central axes correspond with the gaps between pixel electrodes 3 according to certain embodiments of this invention. The presence of layer 33 substantially reduces the parasitic capacitance of the capacitor created between pixel electrodes 3 and address lines 5 in the overlap areas 18 as set forth above.

This invention will now be described with respect to certain examples set forth below in Chart 1.

CHART 1

| | Insulating Layer 33 Material | Overlap distance "w" | Distance "d" | Line-Pixel Capacitance (fF) | Dielectric Constant ∈ |
|---|---|---|---|---|---|
| Example 1 | BCB | 1 μm | 2 μm | 4.5 | 2.7 |
| Example 2 | BCB | 2 μm | 2 μm | 6.9 | 2.7 |
| Example 3 | BCB | 1 μm | 1 μm | 6.9 | 2.7 |
| Example 4 | BCB | 2 μm | 1 μm | 11.7 | 2.7 |
| Example 5 | Fuji Clear ™ | 1 μm | 2 μm | 7.5 | 4.5 |
| Example 6 | Fuji Clear ™ | 2 μm | 2 μm | 11.5 | 4.5 |
| Example 7 | Fuji Clear ™ | 1 μm | 1 μm | 11.5 | 4.5 |
| Example 8 | Fuji Clear ™ | 2 μm | 1 μm | 19.4 | 4.5 |

The values set forth above in Chart 1 are for a display wherein the side of each pixel electrode 3 which overlaps the address line is about 100 μm long. Thus, the area of overlap is about 100 μm long. Also, the dielectric constants ∈ in Chart 1 and for insulating layer 33.

Distances "w" and "d" are shown in FIG. 7, with distance "w" being the width of the overlap and distance "d" the vertical spacing between the pixel electrodes and the overlapped address lines.

Compare the values in Chart 1 with a conventional coplanar LCD in which the pixel electrodes are substantially coplanar with the address lines and spaced therefrom, such a conventional LCD having a line-pixel capacitance of about 11.8 fF (caused in part by the LC material) when the electrodes are spaced laterally from the address lines by about 5 μm, and about 9.6 fF when the lateral spacing is about 10 μm. Thus, the high aperture LCDs of Examples 1-8 have a higher pixel aperture ratio than conventional LCDs without suffering from substantially higher line-pixel capacitance values. The capacitance values set forth above in Chart 1 were arrived at from the $C_{PL}$ equation above in combination with taking into consideration the fringing capacitance in a known manner.

The line pixel capacitance (fF) is less than about 20 fF, preferably less than or equal to about 12 fF, and most preferably less than or equal to about 7.0 fF according to this invention with the overlap areas and high pixel apertures.

Once given the above disclosure, many other features, modifications, and improvements will become apparent to the skilled artisan. Such other features, modifications, and improvements are, therefore, considered to be a part of this invention, the scope of which is to be determined by the following claims.

We claim:
1. A method of making an array of thin film transistors (TFTs) comprising:
   providing a substrate;
   forming a plurality of gate electrodes and gate address lines on the substrate, the gate address lines being connected to the gate electrodes;
   forming a gate insulating layer over the gate electrodes;
   forming a semiconductor layer over each of the gate electrodes;
   forming source and drain electrodes with a channel there between and a plurality of drain address lines;
   forming a photo-imageable insulating layer having a dielectric constant less than about 5.0 over a substantial portion of the substrate;
   forming a plurality of vias in the photo-imageable insulating layer, at least one via corresponding to a thin film transistor in the array; and
   forming a plurality of pixel electrodes over the photo-imageable insulating layer, each pixel electrode contacting a respective source electrode-of the thin film transistor through the at least one via;
   wherein the pixel electrode on the substrate overlaps at least one of the gate address and drain address lines whereby the pixel electrodes are insulated from the gate address and drain address lines in the overlap area by the photo-imaged insulating layer, and
   wherein the parasitic capacitance corresponding to an overlap of said each pixel electrode to one of the gate address and drain address lines is no greater than 0.01 pF.

2. The method of claim 1, wherein the photo-imageable insulating layer has a dielectric constant of less than about 3.0 over a substantial portion of the substrate.

3. The method of claim 1, wherein the photo-imageable insulating layer has a thickness of about 1.5 μm in areas where the pixel electrode overlaps one of the gate address and drain address lines.

4. The method of claim 1, wherein the pixel pitch of the display is about 150 μm.

5. A method of making a liquid crystal display including an array of thin film transistors (TFTs), comprising:
   forming an array of semiconductor based TFTs and corresponding address lines on a substrate;
   forming an organic insulating layer on the first substrate over the TFTs and address lines, the organic insulating layer having a dielectric constant of less than about 5.0;
   photo-imaging the insulating layer to forming a plurality of contact holes therein; and
   forming an array of pixel electrodes over the photo-imaged insulating layer so that each pixel electrode communicates with one of the TFTs through a corresponding one of the contact holes in the insulating layer,
   wherein the pixel electrodes overlap at least one of the address lines thereby resulting in a high aperture display which includes a pixel aperture ratio greater than a display without such overlap and a parasitic capacitance corresponding to an overlap of one of the pixel electrodes to one of the address lines is no greater than 0.01 pF.

6. The method of claim 5, wherein the organic insulating layer has a dielectric constant of less than about 3.0.

7. The method of claim 5, wherein the organic insulating layer is from about 1.0 to 2.5 μm thick.

8. The method of claim 7, wherein the insulating layer is substantially transparent.

9. A method of making a liquid crystal display having a substrate including an array of transistors, comprising:

forming an array of transistors and corresponding address lines on the substrate;

forming an insulating layer on the substrate over the transistors and address lines, the insulating layer having a dielectric constant of less than about 5.0 and a thickness in areas thereof of at least about 1.0 µm;

photo-imaging the insulating layer to form a plurality of contact holes therein;

forming a plurality of pixel electrodes over the photo imaged insulating layer so that each pixel electrode overlaps at least a portion of at least one of the address lines and communicates with one of the transistors through a corresponding one of the contact holes in the insulating layer; and providing the insulating layer in a thickness of at least about 1.0 µm in areas thereof so that the line-pixel capacitance between at least one of the address lines and an overlapping pixel electrode sandwiching the insulating layer there between is less than about 20 fF.

10. The method of claim 9, wherein the insulating layer has a dielectric constant of less than about 3.0 over a substantial portion of the substrate.

11. The method of claim 9, wherein the insulating layer has a thickness of about 1.5 µm in areas where the pixel electrode overlaps one of the address lines.

12. The method of claim 9, wherein the line-pixel capacitance is less than or equal to 12 fF.

* * * * *